United States Patent

[11] 3,585,407

[72] Inventor Neal W. Vinson
Oakland, Calif.
[21] Appl. No. 687,611
[22] Filed Dec. 4, 1967
[45] Patented June 15, 1971
[73] Assignee Bechman Instruments, Inc.

[54] A COMPLEMENTARY TRANSISTOR SWITCH USING A ZENER DIODE
2 Claims, 3 Drawing Figs.

[52] U.S. Cl. .......... 307/255, 307/313, 307/318
[51] Int. Cl. .......... H03k 17/00
[50] Field of Search .......... 307/255, 313, 257, 318

[56] References Cited

UNITED STATES PATENTS

| | | | |
|---|---|---|---|
| 3,375,455 | 3/1968 | Motta | 307/313 X |
| 3,444,393 | 5/1969 | Sassler | 307/313 X |
| 3,323,071 | 5/1967 | Mitchell | 307/318 |
| 3,341,713 | 9/1967 | Shaffer et al. | 307/318 |
| 3,493,789 | 2/1970 | Sether | 307/318 |
| 3,423,683 | 1/1969 | Kelsey | 307/235 |

OTHER REFERENCES

Erdman, IBM TECH. DISCLOSURE Vol. 5 No. 11 April 1963 p. 50
Mello, IBM TECH. DISCLOSURE Vol. 10 No. 5 Oct. 1967

*Primary Examiner*—Donald D. Forrer
*Assistant Examiner*—L. M. Anagnos
*Attorneys*—Richard M. Jennings and Robert J. Steinmeyer ABSTRACT: A high-speed electronic-switching circuit including two functionally interdependent stages, each stage comprising a pair of complementary transistors. The transistor of the output stage have their collector electrodes connected directly to each other and to an output terminal and their emitter electrodes connected to separate sources of potential. The transistors of the input stage have their base electrodes connected to a voltage dividing network including a Zener diode, and through that network to an input signal that alternately drives each transistor of the output pair of transistors into saturation in accordance with the level of the input signal to thereby alternately couple each potential source to the output terminal to produce a resultant output signal having predetermined upper and lower voltage levels.

PATENTED JUN 15 1971 3,585,407

INVENTOR.
NEAL W. VINSON
BY Richard M. Jennings
ATTORNEY

A COMPLEMENTARY TRANSISTOR SWITCH USING A ZENER DIODE

This invention relates in general to electronic switches and more particularly to an electronic switch that is substantially insensitive to noise appearing in the input signal and is adapted to connect an output terminal to power supplies having predetermined upper and lower voltage levels which may be selectively adjusted.

In many applications for digital electronics it is desirable to actuate a switch with an input signal and, in response thereto, to provide an output signal which varies between two predetermined voltage levels. For example, in an instrument for testing integrated circuits, it is necessary to provide such a signal so as to accurately ascertain the performance characteristic of each integrated circuit being tested.

Accordingly, an object of this invention is to provide an improved switch of that type.

This and other objects of the present invention are achieved by a switching circuit including two functionally interdependent stages, each stage comprising a pair of complementary transistors. The transistors of the output stage have their collector electrodes connected directly to each other and to an output terminal and their emitter electrodes connected to separate sources of potential. The transistors of the input stage have their base electrodes connected to a voltage dividing network including a Zener diode, and through that network to an input signal that alternately drives each transistor of the output pair of transistors into saturation in accordance with the level of the input signal to thereby alternately couple each potential source to the output terminal to produce a resultant output signal having predetermined upper and lower voltage levels.

Other objects and advantages will become apparent from the following disclosure taken in conjunction with the accompanying drawings in which.

Figure 1:
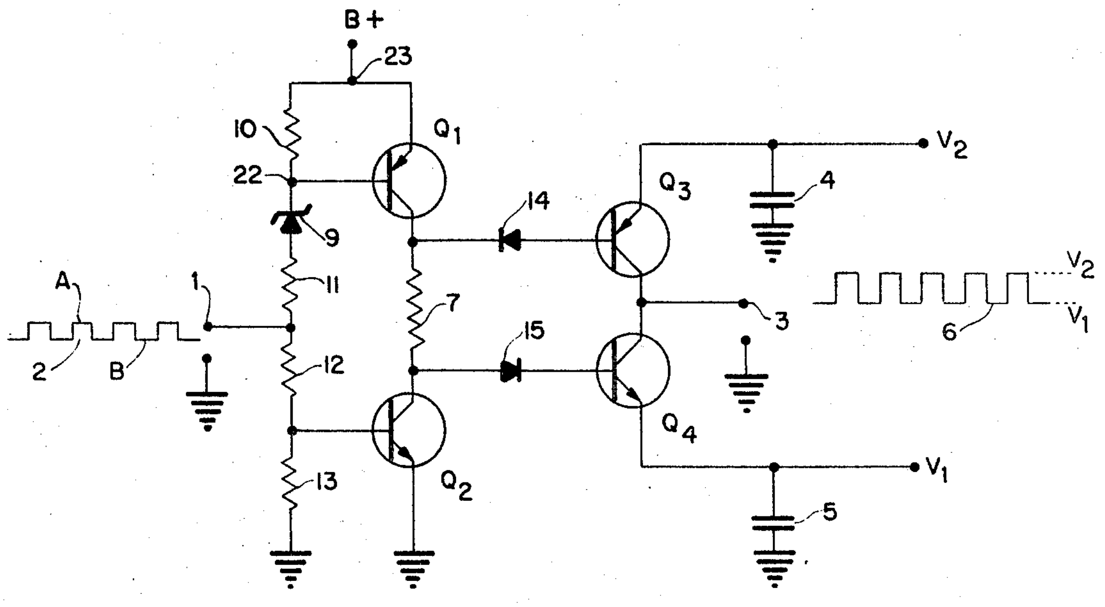
FIG. 1 is a diagram of the present invention.

With reference now to the drawings and more particularly FIG. 1 thereof, a switching circuit is shown having an input terminal 1 upon which is impressed a suitable input signal 2. Although the input signal 2 is illustrated as a substantially square waveform, such as a clock pulse train, it will be appreciated that the invention is fully operative in connection with other signal waveforms. The switching circuit responds to the input signal 2 to provide by way of a pair of complementary transistors $Q_1$ and $Q_2$ an output signal 6 at a terminal 3 which is connected to the collector electrodes of complementary transistors $Q_3$ and $Q_4$.

Transistor $Q_3$ is of a PNP type while transistor $Q_4$ is of a NPN type so that the control signal provided through complementary transistors $Q_1$ and $Q_2$ alternately drives into saturation or turns "on" the complementary transistors $Q_3$ and $Q_4$. By alternately turning "on" transistors $Q_3$ and $Q_4$ in this manner there is provided the output signal 6 having predetermined voltage levels $V_1$ and $V_2$ at the output terminal 3.

Figure 2:
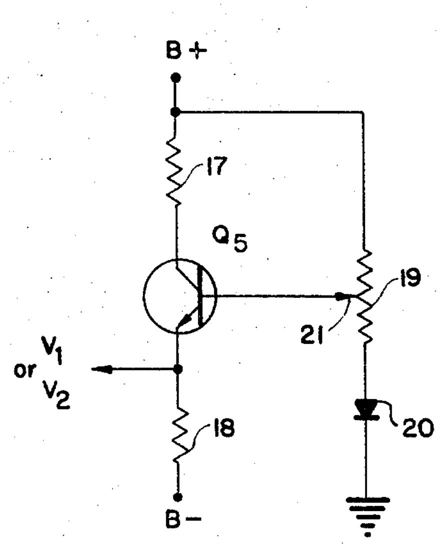
FIG. 2 is a diagram of a circuit for providing stable $V_1$ and $V_2$ potential sources for the electronic switching circuit of FIG. 1.

The voltages $V_1$ and $V_2$ are connected directly to the emitters of transistors $Q_3$ and $Q_4$, respectively, and are derived from stable voltage supply circuits such as that shown in FIG. 2 to be presently described. Capacitors 4 and 5 are connected in parallel with the voltage supply circuits to filter any noise appearing in the applied voltages $V_1$ and $V_2$.

Power for the transistors $Q_1$ and $Q_2$ is supplied by a suitable source of bias potential $B^+$ connected across a first series circuit including current limiting resistor 7 connected between the collector electrodes of the transistors $Q_1$ and $Q_2$ and a voltage dividing network comprising a Zener diode 9 and resistors 10 through 13 connected in parallel with the first circuit. Since transistor $Q_1$ is of a PNP type its emitter electrode is connected directly to the positive side of bias potential source $B^+$ to forward bias its emitter-base junction. On the other hand, transistor $Q_2$ being an NPN transistor has its emitter electrode connected to a negative bias potential or ground as shown, to forward bias its emitter-base junction. To complete the bias network, the base of transistor $Q_1$ is connected between resistor 10 and Zener diode 9 at point 22 while transistor $Q_2$ has its base connected between resistors 12 and 13.

Figure 3:
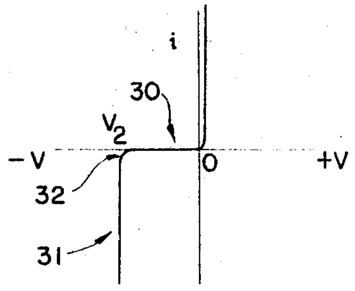
FIG. 3 is a graphical representation of the current v. voltage characteristic of a Zener diode.

The function of Zener diode 9 may be best understood by reference to the operating characteristic of a typical Zener diode as illustrated in FIG. 3. The voltage applied to the anode is plotted along the abscissa and the current through the diode is plotted along the ordinate. When the Zener diode is forward biased by a positive voltage on its anode, assuming the cathode to be connected to a source of reference potential, it behaves as a conventional diode, that is, a sharp increase in current with a small voltage drop thereacross, typically less than one volt. However, upon applying a reverse bias voltage, the Zener diode first enters a high resistance region 30 wherein the current is essentially zero. As the reverse bias voltage is increased the diode passes through its high resistance region 30 until the applied voltage reaches the predetermined Zener breakdown voltage $V_z$ of typically 10 volts. At voltage $V_z$ the diode instantly enters a low resistance region 31 where it again becomes highly conductive with a constant voltage drop there across. In practice, as the breakdown voltage ($V_z$) of a Zener diode is increased, the knee 32 around which the diode switches becomes increasingly sharper. For this invention a sharp knee is desired.

Referring again to FIG. 1, Zener diode 9 is reverse biased by connecting its cathode to the positive side of the $B^+$ potential bias supply so it will operate around the knee 32 of its characteristic curve. In this manner Zener diode 9, when operating in its low impedance region 31, offsets the base electrode of transistor $Q_1$ by a fixed voltage to insure that transistor $Q_1$ is turned "on." For example, assuming a $B^+$ bias of +12 volts, and an input signal 2 which varies between the levels of +5 volts and −2 volts, when the input signal appearing at terminal 1 is at its high level of +5 volts the effective reverse voltage applied across Zener diode 9 is around 7 volts. This is, of course, much less than the Zener breakdown voltage ($V_z$) of 10 volts and, thus, the diode is switched to its high resistance region 30. With Zener diode 9 operating in region 30, only a small leakage current flows through the diode between point 23 and input terminal 1. It therefore follows that the voltage drop across resistor 10 is small so that the base of transistor $Q_1$ rises to almost the same voltage as its emitter. The transistor $Q_1$ is then insufficiently forward biased to conduct.

When input signal 2 falls to its low level of −2 volts the reverse voltage applied to Zener diode 9 increases to around 14 volts and switches the operation of the diode around knee 32 into its low resistance region 31. In this region Zener diode 9 conducts heavily so that a large current flows and causes a large voltage drop across resistor 10. The base electrode of transistor $Q_1$ is thereby driven to a more negative potential than its emitter electrode to cause it to conduct. Since the voltage drop across Zener diode 9 remains substantially constant in region 31, despite variations in the input signal, the point 22 to which the base of transistor $Q_1$ is connected is always offset from the terminal 1 by at least such a voltage. This fixed offset makes transistor $Q_1$ less sensitive to noise and slight fluctuations in the level of the input signal, as well as providing a fixed reference at which the switch is actuated.

The values of resistors 10 through 13 and Zener diode 9 are selected so that the "on" condition of transistors $Q_1$ and $Q_2$, as governed by the level of the input signal, overlaps for a brief moment. Since transistors $Q_1$ and $Q_2$ control the state of transistors $Q_3$ and $Q_4$, such overlap causes transistor $Q_3$ to turn "off" before transistor $Q_4$ turns "on" and vice versa, to thereby eliminate current spiking, which is due to the rapid turning "on" of one transistor prior to the turning "off" of the other transistor in the output stage.

The control signal provided by transistors $Q_1$ and $Q_2$ is impressed upon the base electrode of transistor $Q_3$ by way of diode 14 and applied to the base electrode of transistor $Q_4$ via a second diode 15. Diodes 14 and 15 are suitably poled to prevent current from flowing in the reverse direction and perhaps damaging transistors $Q_3$ and $Q_4$ when they are back biased. For example, when a positive voltage is applied to the base of transistor $Q_3$, diode 14 is reversed biased and, thus, provides a large voltage drop to prevent an excessive potential from being applied across transistor $Q_3$. Diode 15 acts in a similar manner when a negative going signal is coupled to the base of transistor $Q_4$.

The stable voltage signals $V_1$ and $V_2$, which are impressed upon the emitter inputs of transistors $Q_3$ and $Q_4$ shown in FIG. 1, may be supplied by a circuit such as that shown in FIG. 2. This circuit includes a transistor $Q_5$ connected in an emitter follower configuration. To this end the collector electrode of transistor $Q_5$ is connected to the positive side of a $B^+$ power supply by way of a current limiting resistor 17, while the emitter electrode is connected to the negative potential through a load resistor 8 across which the stable voltage signals $V_1$ is $V_2$ are developed.

A series network comprising a rheostat 19 including an adjustable tap 21 and diode 20 is connected in series with the $B^+$ power supply. The base of emitter follower $Q_5$ is connected to the adjustable tap 21 so that the input signal to the base may be selectively varied to thereby adjust the level of the voltage output appearing across load resistor 18 to a predetermined value. In practice, the magnitude of the voltage may be raised from about 0 volts to a maximum of around 10 volts.

Referring again to FIG. 1, in operation, the input signal 2 is simultaneously applied to the base electrodes of transistors $Q_1$ and $Q_2$ by way of input terminal 1. When the input signal is at its high level A transistor $Q_1$ is turned "off" while transistor $Q_2$ is turned "on." Conversely, upon falling to its low level B, the input signal turns "off" transistor $Q_2$ and turns "on" transistor $Q_1$.

When transistor $Q_2$ is turned "on" a current signal is applied to the base of transistor $Q_3$ through the current path including the emitter-collector electrodes of transistor $Q_2$, resistor 7, diode 14, and the base-emitter electrodes of transistor $Q_3$. Transistor $Q_3$ is turned "on" by the applied signal so that the voltage signal $V_2$ appears at the output terminal 3. At the same time, since transistor $Q_2$ is turned "on," its collector falls to ground which is at a negative potential. This negative potential is in turn impressed across the base-emitter junction of transistor $Q_4$ to back bias transistor $Q_4$ and hold it in a nonconductive state.

Turning "on" transistor $Q_1$ causes a current signal to flow through the path comprising the emitter-collector electrodes of transistor $Q_1$, resistor 7, diode 15, and the base-emitter junction of transistor $Q_4$. This signal turns "on" transistor $Q_4$ to couple voltage signal $V_1$ directly to the output terminal 3. While transistor $Q_1$ is turned "on" its collector electrode rises toward the positive side of the $B^+$ bias potential which positive going voltage is coupled across the base-emitter junction of transistor $Q_3$ to back bias this transistor and hold it in a nonconductive condition.

Thus, by alternately switching transistor $Q_3$ and $Q_4$ "on" and "off" in this manner, there is provided a resultant output signal which varies between two predetermined voltage levels at the same rate as the input signal. As previously discussed, the voltage levels of the output signal may be selectively varied by merely adjusting rheostat 19 in the base circuit of the emitter follower $Q_5$ illustrated in FIG. 2. Also, it should be noted that, in accordance with the principles of the present invention, both transistors $Q_3$ and $Q_4$ are turned "on" (saturated) and thus present a very low source impedance to the load, which effectively damps any tendency for the circuit to ring when it is connected to an inductive load.

Numerous modifications and departures from the specific apparatus described herein may be made by those skilled in the art without departing from the inventive concept of the invention. Accordingly, the invention is to be construed as limited only by the spirit and scope of the appended claims.

I claim:

1. A high-speed switching circuit comprising:
a power supply;
a series network comprising first and second complementary transistors each having emitter, collector and base electrodes, the emitter electrode of each transistor being connected to opposite sides of said power supply, and a resistor interconnecting the collector electrodes of said transistors;
a voltage dividing network comprising at least one resistor and a Zener diode connected in series with said power supply and in parallel with said series network, said Zener diode being reversed bias to operate around the knee of its operating characteristic between the high resistance region and the breakdown region;
means for connecting the base electrode of said first transistor to the junction point between said resistor and said Zener diode;
means for connecting the base electrode of said second transistor to the other side of said Zener diode;
a third transistor complementary to said second transistor with its base electrode connected to the collector electrode of said first transistor;
a fourth transistor complementary to said first transistor with its base electrode connected to the collector electrode of said second transistor;
the collector electrode of said third and fourth transistors being connected directly to each other and to an output terminal;
a first potential source having a first selected voltage level connected to the emitter electrode of said third transistor;
a second potential source having a second selected voltage level connected to the emitter electrode of said fourth transistor; and
means for impressing an input signal having an amplitude which varies between two selected levels simultaneously upon the Zener diode and the base electrode of said second transistor to alternately drive said first and fourth transistors and said second and third transistors, respectively, into saturation whereby the first and second selected voltage levels are alternately coupled to the output terminal to provide an output signal varying between selected voltage levels.

2. A high-speed switching circuit as defined in claim 1 comprising in addition a first diode connected between the collector electrode of said first transistor and the base electrode of said third transistor, and a second diode connected between the collector electrode of said second transistor and the base electrode of said fourth transistor, both said electrodes being suitably poled to prevent an excessive back bias potential from being applied across said third and fourth transistors.